United States Patent
Tsai

(10) Patent No.: US 10,908,221 B2
(45) Date of Patent: Feb. 2, 2021

(54) BATTERY POWER ESTIMATING METHOD AND ELECTRONIC DEVICE

(71) Applicant: Acer Incorporated, New Taipei (TW)

(72) Inventor: Chin-Yi Tsai, New Taipei (TW)

(73) Assignee: Acer Incorporated, New Taipei (TW)

( * ) Notice: Subject to any disclaimer, the term of this patent is extended or adjusted under 35 U.S.C. 154(b) by 25 days.

(21) Appl. No.: 16/283,828

(22) Filed: Feb. 25, 2019

(65) Prior Publication Data

US 2020/0150186 A1 May 14, 2020

(30) Foreign Application Priority Data

Nov. 8, 2018 (TW) .............................. 107139732 A

(51) Int. Cl.
*G01R 31/382* (2019.01)
*G01R 31/374* (2019.01)
*H02J 7/00* (2006.01)

(52) U.S. Cl.
CPC ......... *G01R 31/382* (2019.01); *G01R 31/374* (2019.01); *H02J 7/0063* (2013.01)

(58) Field of Classification Search
CPC ............................ G01R 31/382; G01R 31/374; G01R 31/3648; H02J 7/0063; H01M 10/48; Y02T 10/705; B60L 58/12
USPC ............. 324/415, 437, 425–433, 76.11, 126, 324/756.05, 538, 200, 207.13, 233, 256, 324/515, 500–530, 750.06
See application file for complete search history.

(56) References Cited

U.S. PATENT DOCUMENTS

| 2013/0093429 A1* | 4/2013 | Huang | H02J 7/0047 |
|---|---|---|---|
|  |  |  | 324/433 |
| 2018/0106867 A1* | 4/2018 | Yun | G01R 31/367 |
| 2018/0313903 A1 | 11/2018 | Hindle et al. |  |

FOREIGN PATENT DOCUMENTS

| CN | 103076571 | 5/2013 |
| TW | 201133985 | 10/2011 |
| TW | I419390 | 12/2013 |
| TW | 201834348 | 9/2018 |
| TW | I634720 | 9/2018 |
| WO | 2017155260 | 9/2017 |

\* cited by examiner

*Primary Examiner* — Vincent Q Nguyen
*Assistant Examiner* — Trung Nguyen
(74) *Attorney, Agent, or Firm* — JCIPRNET

(57) ABSTRACT

Embodiments of the present disclosure provide a battery power estimating method. The method includes: performing a discharge operation of a battery; detecting, by an impedance component, a plurality of current values generated by the discharge operation of the battery during a time range, wherein the impedance component is coupled to a discharge path of the battery; obtaining a first average current value of the current values; obtaining a value distribution status of the current values; and estimating a remaining power of the battery according to the first average current value, the value distribution status and an initial power of the battery.

12 Claims, 3 Drawing Sheets

BATTERY POWER ESTIMATING METHOD AND ELECTRONIC DEVICE

CROSS-REFERENCE TO RELATED APPLICATION

This application claims the priority benefit of Taiwan application serial no. 107139732, filed on Nov. 8, 2018. The entirety of the above-mentioned patent application is hereby incorporated by reference herein and made a part of this specification.

BACKGROUND

Technical Field

The disclosure relates to a power management technology, and in particular to a battery power estimating method and an electronic device.

Description of Related Art

In general, the mechanism used to evaluate the remaining power (also known as State of Charge, SOC) of a battery in an electronic device includes the open circuit voltage method, the Coulomb counting method, the Kalman filter method, and the neural network method. The open circuit voltage method and the Coulomb counting method are most often used because of the ease of design. However, if the change of the battery voltage is considered under the state of discharge and the state of non-use, then the accuracy of the open circuit voltage method is greatly reduced. The estimation accuracy of the Coulomb counting method is easy to be influenced due to battery aging. The Kalman filtering method and the neural network method require high computing power, and the demand for hardware chips is also high, which leads to implementation difficulty. In addition, the temperature may also affect the estimation accuracy of the remaining power of the battery. If the estimation accuracy of the remaining power of the battery is low, it may affect the operation of the electronic device. For example, if an electric vehicle is about to run out of power but its control panel shows that there is still 20% of the battery remaining power, then the driving safety of such electric vehicle may be seriously affected. In addition, other types of electronic devices may also cause sudden power failure due to the estimation misalignment of the remaining power of the battery, which affects the user experience.

SUMMARY

The disclosure provides a battery power estimating method and an electronic device, which are capable of improving the accuracy of the estimation of the remaining power of the battery and preventing the sudden power failure of the electronic device.

Embodiments of the present disclosure provide a battery power estimating method which comprises: performing a discharge operation of a battery; detecting, by an impedance component, a plurality of current values generated by the discharge operation of the battery during a time range, wherein the impedance component is coupled to a discharge path of the battery; obtaining a first average current value of the current values; obtaining a value distribution status of the current values; and estimating a remaining power of the battery according to the first average current value, the value distribution status and an initial power of the battery.

Embodiments of the present disclosure further provides an electronic device which comprises a battery, an impedance component and a power management circuit. The battery is configured to perform a discharge operation to provide power to at least one electronic component of the electronic device. The impedance component is coupled to a discharge path of the battery. The power management circuit is coupled to the battery and the impedance component. The power management circuit detects, by the impedance component, a plurality of current values generated by the discharge operation of the battery during a time range. The power management circuit obtains a first average current value of the current values and a value distribution status of the current values. The power management circuit estimates a remaining power of the battery according to the first average current value, the value distribution status and an initial power of the battery.

Based on the above, after the discharge operation of the battery is performed, a plurality of current values generated by the discharge operation of the battery may be detected by the impedance component during a time range. Then, the first average current value of the current values and the value distribution status of the current values may be obtained. The remaining power of the battery may be estimated according to the first average current value, the value distribution status and the initial power of the battery. Therefore, the estimated remaining power of the battery may be corrected in response to the value distribution status of the current values, thereby increasing the estimation accuracy.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
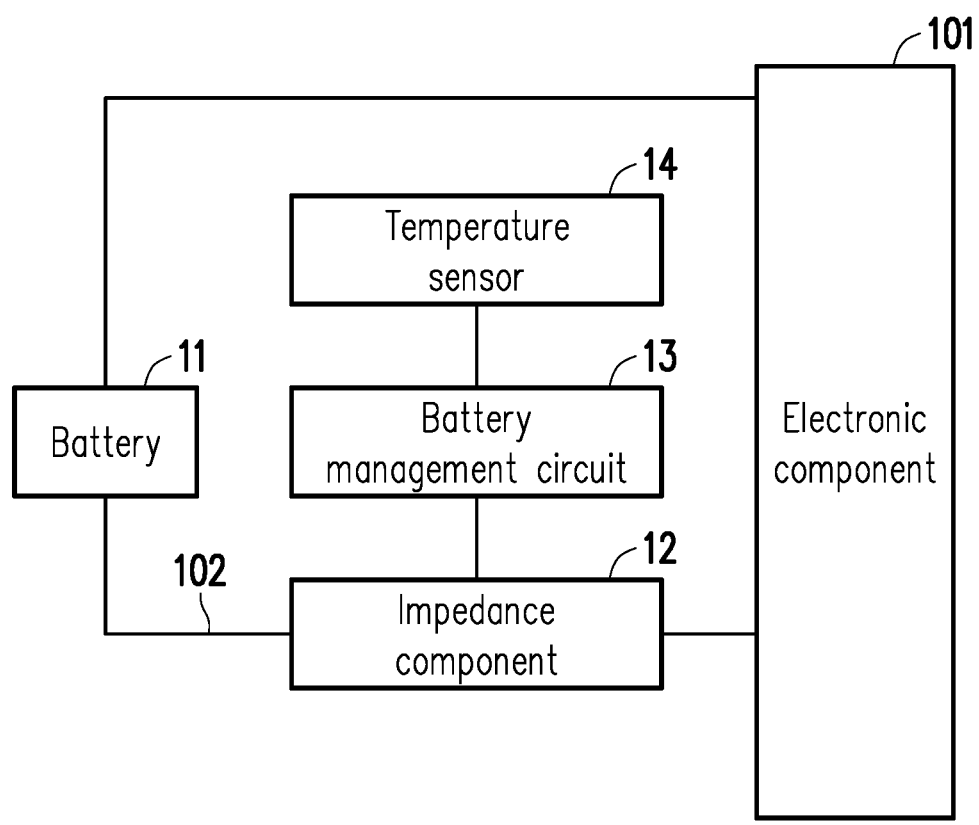
FIG. 1 is a schematic diagram of an electronic device according to an embodiment of the disclosure.

FIG. 1 is a schematic diagram of an electronic device according to an embodiment of the disclosure. Referring to FIG. 1, an electronic device 10 may be an electronic device powered by a battery, such as a smart phone, a tablet computer, a notebook computer, a desktop computer, an industrial computer, a smart watch, or an electric vehicle, and the type of the electronic device 10 is not limited thereto.

The electronic device 10 includes an electronic component 101, a battery 11, an impedance component 12, and a power management circuit 13. The electronic component 101 is coupled to the battery 11. The electronic component 101 may be various electronic components in the electronic device 10 that need to be powered by the battery 11 to function normally. Taking a smart phone as an example of the electronic device 10, the electronic component 101 may include a processor, a storage apparatus, and various input/ output device (e.g., a panel, a network interface card, a microphone, a speaker, etc.). Alternatively, taking an electric vehicle as an example of electronic device 10, the electronic component 101 may include a drive motor, a control panel, an audio device, a lamp, and the like. In addition, the electronic component 101 may further include other types of electronic components that can receive power provided by the battery 11 to operate, and the disclosure is not limited thereto. In an embodiment, the electronic component 101 can be considered as a load of the battery 11.

The battery 11 is configured to perform a discharge operation to provide power to the electronic component 101. For example, the battery 11 may include at least one of a nickel-cadmium (Ni—Cd) battery, a nickel-hydrogen (Ni—MH) battery, a lithium ion (Li-Ion) battery, a lithium polymer (Li-polymer) battery, and a lead acid battery, and the type of the battery 11 is not limited thereto. Further, the number of the battery 11 may be one or more, and the present disclosure is not limited thereto.

The impedance component 12 may include an electronic component that can provide impedance, such as a resistor or a reactance. The number of impedance component 12 can be one or more. The impedance component 12 is coupled to a discharge path 102 of the battery 11. For example, the discharge path 102 can be used to connect the battery 11 and the electronic component 101, and the battery 11 can provide power to the electronic component 101 via the discharge path 102. In an embodiment, the impedance component 12 can be serially connected to discharge path 102. However, in another embodiment, the impedance component 12 can also be coupled to the discharge path 102 in parallel or the like, which is not limited by the present disclosure.

The power management circuit 13 is coupled to the electronic component 101, the battery 11 and the impedance component 12. The power management circuit 13 may include one or more chips (or chip sets). For example, the power management circuit 13 may include a processor, or other programmable general purpose or special purpose microprocessor, digital signal processor, programmable controller, special application integrated circuit, programmable logic apparatus or the like apparatus or a combination of these apparatuses. In one embodiment, the power management circuit 13 is also referred to as a power management chip (or a power chip).

After the battery 11 starts performing the discharge operation, the power management circuit 13 may detect a plurality of current values generated by the discharge operation of the battery 10 via the impedance component 12 during a time range. For example, at a specific time point in this time range, the power management circuit 13 may detect a current value in response to an impedance provided by the impedance component 12. Any two current values detected by the impedance component 12 at different time points within the time range may be different.

The power management circuit 13 may obtain an average current value (also referred to as first average current value) of these current values. For example, the power management circuit 13 may continuously record the measured N current values and divide the sum of the N current values by N to obtain the first average current value. N may be 60 or other positive integers.

The power management circuit 13 may obtain a value distribution status of these current values. The value distribution status may reflect a numerical trend of these current values. For example, the value distribution status may reflect the status of the numerical distribution of the plurality of current values with respect to the first average current value.

In an embodiment, the power management circuit 13 may obtain the number (also referred to as first number) of a current value (also referred to as first current value) which is greater than the first average current value among these current values. Furthermore, the power management circuit 13 may obtain the number (also referred to as second number) of a current value (also referred to as second current value) that is less than (or not greater than) the first average current value among these current values. Then, the power management circuit 13 may obtain the value distribution status (or the numerical trend) of these current values according to the first number and the second number. In an embodiment, the value distribution status of these current values may reflect the first number. In an embodiment, the value distribution status of these current values may reflect the second number. In an embodiment, the value distribution status of these current values may reflect the ratio between the first number and the second number. In addition, in another embodiment, the power management circuit 13 may obtain the value distribution status of these current values by other rules, and the disclosure is not limited.

The power management circuit 13 may estimate the remaining power of the battery 11 based on the first average current value, the value distribution status, and initial power of the battery 11. It is noted that, in the following embodiments, the power of the battery is measured based on the unit of Coulomb counting. However, in other embodiments, the power of the battery may also be evaluated in other numerical units, which are not limited in the present disclosure.

In an embodiment, the power management circuit 13 may obtain the initial power of the battery 11 by the open circuit voltage method. For example, the power management circuit 13 may detect an open circuit voltage value of the battery 11 before the battery 10 begins to perform the discharge operation. For example, the power management circuit 13 may detect the open circuit voltage value of the battery 11 when there is no load on the battery 11. Then, the power management circuit 13 may obtain the initial power of the battery 11 based on the open circuit voltage value. For example, the power management circuit 13 may query a management table based on the open circuit voltage value to obtain power corresponding to this open circuit voltage value. For example, the management table may record multiple open circuit voltage values and corresponding powers. The power management circuit 13 may select one of the plurality of powers recorded in this management table as the initial power of the battery 11 based on the open circuit voltage value. Alternatively, in another embodiment, the power management circuit 13 may directly read the remaining power of the battery 11 which is recorded previously from a non-volatile storage medium (e.g., a read-only memory or a flash memory) of the electronic device 10 as the initial power of the battery 11.

In one embodiment, the power management circuit 13 may determine whether the nonvolatile storage medium of the electronic device 10 stores the remaining power of the battery 11 which is recorded previously. If the non-volatile storage medium of the electronic device 10 does not store the remaining power of the battery 11 which is recorded previously, the power management circuit 13 may obtain the initial power of the battery 11 by the open circuit voltage method. Alternatively, if the non-volatile storage medium of the electronic device 10 already stores the remaining power of the battery 11 which is recorded previously, the power management circuit 13 may directly read the remaining power of the battery 11 from the non-volatile storage medium as the initial power of the battery 11, without performing the open circuit voltage method.

In an embodiment, the power management circuit 13 may adjust the first average current value to another average current value (also referred to as second average current value) according to the value distribution status of these current values. The second average current value is different from the first average current value. For example, the first average current value may be modified or fine-tuned (e.g., increased or decreased) based on the first number and the second number (e.g., the ratio of the first number and the second number), so as to obtain the second average current value.

In an embodiment, the second average current value may be positively correlated to the first number. That is, if the total number of current value among the plurality of current values larger than the first average current value is larger (i.e., the larger the first number), the determined second average current value may be larger. If the total number of current value among the plurality of current values smaller than (or not greater than) the first average current value is larger (i.e., the larger the second number), the determined second average current value may be smaller.

In an embodiment, the power management circuit 13 may determine a weight parameter based on the first number, the second number, or the ratio of the first number and the second number. For example, the power management circuit 13 may divide the first number by the second number to obtain the weight parameter. The power management circuit 13 may multiplies the first average current value by the weight parameter to obtain the second average current value. Then, the power management circuit 13 may estimate the remaining power of the battery 11 based on the second average current value and the initial power of the battery 11.

In an embodiment, the power management circuit 13 may estimate the remaining power of the battery 11 according to equations (1.1) to (1.3) below.

$$SOC = SOC_0 - CC_a \qquad (1.1)$$

$$CC_a = \frac{CC}{\left(\frac{I_n}{I_a}\right)^{k-1}} \qquad (1.2)$$

$$CC = I_a \times T \qquad (1.3)$$

In the equations (1.1) to (1.3), the parameter $I_a$ represents the second average current value, the parameter T represents the time range for measuring the plurality of current values, the parameter $I_n$ represents a preset current value of the battery 11, and k represents a constant (for example, a value between 1 and 1.28), the parameter $CC_a$ represents the estimated power of the battery 11 consumed in the time range, the $SOC_0$ represents the initial power of the battery 11, and the SOC represents the estimated remaining power of the battery 11. In one embodiment, the estimated remaining power of the battery 11 is more accurate because of the consideration of the value distribution status of the plurality of current values measured during the time range.

In an embodiment of FIG. 1, the electronic device 10 further includes a temperature sensor 14. The temperature sensor 14 may be disposed on the surface of the battery 11 or in the vicinity of the battery 11. The power management circuit 13 may sense the temperature of the battery 11 via the temperature sensor 14. Then, the power management circuit 13 may estimate the remaining power of the battery 11 based on the temperature of the battery 11.

In an embodiment, the power management circuit 13 may estimate the remaining power of the battery 11 according to equations (1.1), (1.3) and equation (2.1) below.

$$CC_a = \frac{CC}{\frac{1}{1+\alpha(\tau_n - \tau)} \times \left(\frac{I_n}{I_a}\right)^{k-1}} \qquad (2.1)$$

In the equation (2.1), the parameter $\tau$ represents the currently measured temperature of the battery 11, the parameter $\tau_n$ represents a preset standard temperature of the battery 11, and $\alpha$ is a constant (for example, 0.01). With respect to the equation (1.2), the equation (2.1) further considers the temperature of the battery 11, so that the estimated remaining power of the battery 11 can be more accurate. From another perspective, the estimated remaining power (e.g., the parameter SOC) of the battery 11 may be negatively correlated to the second average current value (e.g., the parameter $I_a$) and/or the temperature of battery 11 (e.g., the parameter $\tau$).

In an embodiment, the power management circuit 13 may determine whether the total number of the current values currently obtained is greater than a default value (e.g., 60). If the total number of the current values obtained is greater than the default value, the power management circuit 13 may estimate the remaining power of the battery 11 based on the first average current value, the value distribution status, and the initial power of the battery 11. For example, the power management circuit 13 may estimate the remaining power of the battery 11 according to the equations (1.1), (1.2), and (1.3) or the equations (1.1), (2.1), and (1.3). However, if the total number of the current values obtained is not greater than the default value, the power management circuit 13 may estimate the remaining power of the battery 11 based on the first average current value and the initial power of the battery 11. In other words, if the total number of the current values that have been obtained is not greater than the default value, then in the operation of estimating the remaining power of the battery 11, the power management circuit 13 may not consider the value distribution status of these current values. For example, the power management circuit 13 may estimate the remaining power of the battery 11 according to the following equations (3.1) to (3.3).

$$SOC = SOC_0 - CC_b \qquad (3.1)$$

$$CC_b = \frac{CC}{\frac{1}{1+\alpha(\tau_n - \tau)} \times \left(\frac{I_n}{I_b}\right)^{k-1}} \qquad (3.2)$$

$$CC = I_b \times T \qquad (3.3)$$

In the equations (3.1) to (3.3), the parameter $I_b$ represents the first average current value, and the parameter $CC_b$ represents the estimated power of the battery 11 consumed in the time range. The other parameters are the same or similar to the above definition.

In an embodiment, the power management circuit 13 may continuously record P parameters $CC_a$ obtained at P different time points. Each parameter $CC_a$ represents the estimated power of the battery 11 that is consumed within a certain time range. For example, P may be 60. The power management circuit 13 may obtain an average value of these P parameters $CC_a$. Then, the power management circuit 13 may adjust the average value of the P parameters $CC_a$ according to a value distribution status of the P parameters $CC_a$. For example, the power management circuit 13 may adjust the average value of the P parameters $CC_a$ based on the number (also referred to as third number) of parameter among the P parameters $CC_a$ that is greater than the average value, the number (also referred to as fourth number) of parameter among the P parameters $CC_a$ that is less than (or not greater than) the average and/or the ratio between the third number and the fourth number. The adjusted average value of the P parameters $CC_a$ may be positively correlated to the third number. That is, if the number of parameter among the P parameters $CC_a$ greater than the average value is larger, the power management circuit 13 may increase the average value of the P parameters $CC_a$. On the other hand, if the number of parameter among the P parameters $CC_a$ greater than the average value is less, the power management circuit 13 may decrease the average value of the P parameters $CC_a$.

In an embodiment, the average value of the parameters $CC_a$ can be used to estimate the remaining power of the battery 11. For example, the adjusted average value of the parameters $CC_a$ may be used to replace the parameter $CC_a$ in the equation (1.1) to obtain the remaining power of the battery 11. Thereby, the remaining power of the battery 11 may be estimated in a relatively stable (or gentle or smooth) manner, so as to prevent the estimated remaining power from changing too much in a short time.

Figure 2:
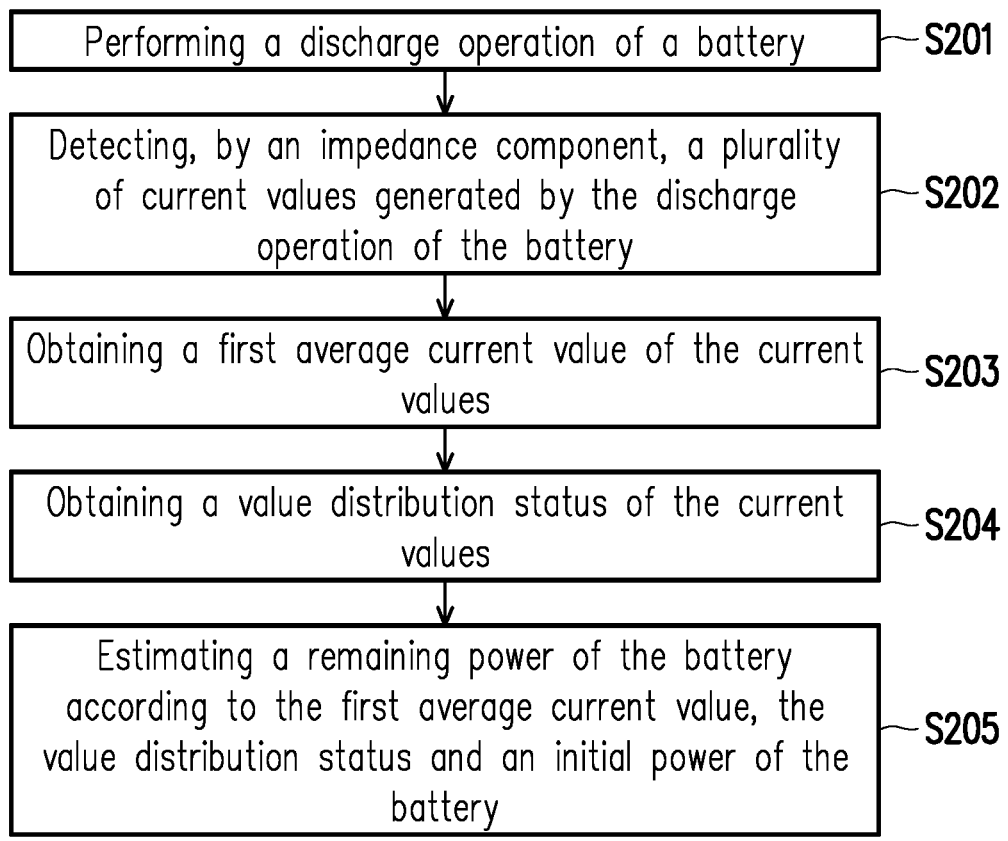
FIG. 2 is a flow chart of a battery power estimating method according to an embodiment of the disclosure.

FIG. 2 is a flow chart of a battery power estimation method according to an embodiment of the disclosure. Referring to FIG. 2, in step S201, a discharge operation is performed by a battery. In step S202, a plurality of current values generated by the discharge operation of the battery are detected by an impedance component during a time range, wherein the impedance component is coupled to a discharge path of the battery. In step S203, a first average current value of these current values are obtained. In step S204, a value distribution status of these current values is obtained. In step S205, a remaining power of the battery is estimated based on the first average current value, the value distribution status, and initial power of the battery.

Figure 3:
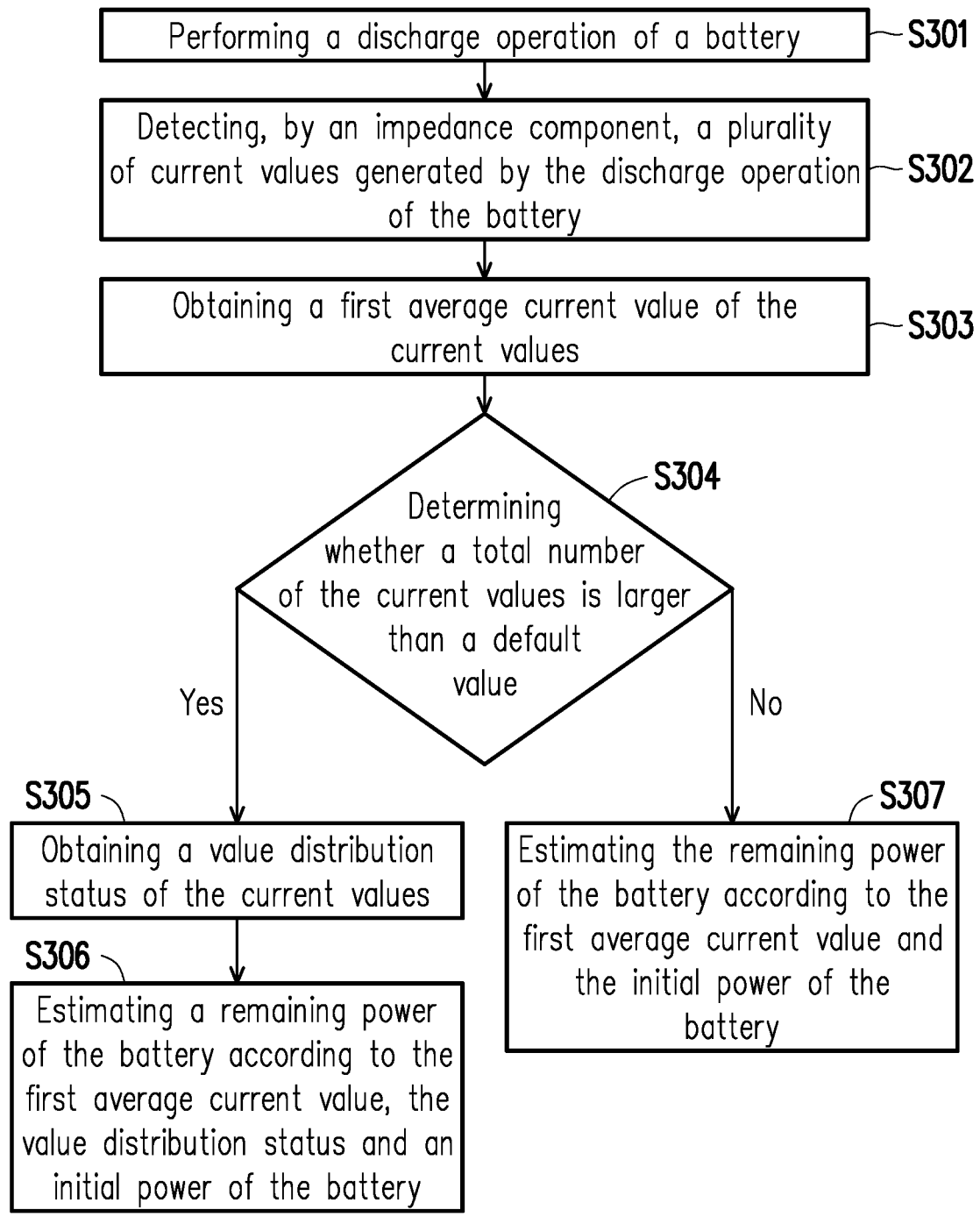
FIG. 3 is a flow chart of a battery power estimating method according to an embodiment of the disclosure.

FIG. 3 is a flow chart of a battery power estimation method according to an embodiment of the disclosure. Referring to FIG. 3, in step S301, a discharge operation is performed by a battery. In step S302, a plurality of current values generated by the discharge operation of the battery are detected by an impedance component during a time range, wherein the impedance component is coupled to a discharge path of the battery. In step S303, a first average current value of these current values are obtained. In step S304, it is determined whether the total number of these current values is greater than a default value. If the total number of these current values is greater than the default value, in step S305, a value distribution status of these current values is obtained. In step S306, a remaining power of the battery is estimated based on the first average current value, the value distribution status, and initial power of the battery. Furthermore, if the total number of these current values is not greater than the default value, in step S307, the remaining power of the battery is estimated based on the first average current value and the initial power of the battery. That is, in step S307, the remaining power of the battery may be estimated without considering the value distribution status of these current values.

However, the steps in FIG. 2 and FIG. 3 have been described in detail above, and will not be described again herein. It should be noted that the steps in FIG. 2 and FIG. 3 can be implemented as a plurality of codes or circuits, and the present disclosure is not limited thereto. In addition, the methods of FIG. 2 and FIG. 3 may be used in combination with the above exemplary embodiments, or may be used alone, and the disclosure is not limited thereto.

In summary, after the discharge operation of the battery is performed, a plurality of current values generated by the discharge operation of the battery may be detected by the impedance component during a time range. Then, the first average current value of the current values and the value distribution status of the current values may be obtained. The remaining power of the battery may be estimated according to the first average current value, the value distribution status and the initial power of the battery. As such, the estimated remaining power of the battery can be corrected in response to the value distribution status of the current values, thereby improving the estimation accuracy and reducing the probability of the electronic device being accidentally powered off due to estimation error of the remaining power of the battery.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A battery power estimating method, comprising:
    performing a discharge operation of a battery;
    detecting, by an impedance component, a plurality of current values generated by the discharge operation of the battery during a time range, wherein the impedance component is coupled to a discharge path of the battery;
    obtaining a first average current value of the current values;
    obtaining a value distribution status of the current values;
    adjusting the first average current value to a second average current value according to the value distribution status of the current values, wherein the second average current value is different from the first average current value; and
    estimating a remaining power of the battery according to the second average current value and an initial power of the battery.

2. The battery power estimating method according to claim 1, further comprising:
    detecting an open circuit voltage value of the battery before the discharge operation of the battery is performed; and
    obtaining the initial power of the battery according to the open circuit voltage value.

3. The battery power estimating method according to claim 1, wherein the step of adjusting the first average current value to the second average current value according to the value distribution status comprises:
    obtaining a first number of a first current value which is larger than the first average current value among the current values;
    obtaining a second number of a second current value which is less than the first average current value among the current values; and adjusting the first average current value to the second average current value according to first number and the second number.

4. The battery power estimating method according to claim 3, wherein the second average current value is positively correlated to the first number.

5. The battery power estimating method according to claim 1, further comprising:
   detecting a temperature of the battery by a temperature sensor; and
   estimating the remaining power of the battery according to the temperature.

6. The battery power estimating method according to claim 1, further comprising:
   determining whether a total number of the current values is larger than a default value; and
   estimating the remaining power of the battery according to the first average current value and the initial power of the battery without considering the value distribution status if the total number of the current values is not larger than the default value.

7. An electronic device, comprising:
   a battery, configured to perform a discharge operation to provide power to at least one electronic component of the electronic device;
   an impedance component, coupled to a discharge path of the battery; and
   a power management circuit, coupled to the battery and the impedance component,
   wherein the power management circuit detects, by the impedance component, a plurality of current values generated by the discharge operation of the battery during a time range,
   the power management circuit obtains a first average current value of the current values and a value distribution status of the current values,
   adjusting the first average current value to a second average current value according to the value distribution status of the current values, wherein the second average current value is different from the first average current value; and
   estimating a remaining power of the battery according to the second average current value and an initial power of the battery.

8. The electronic device according to claim 7, wherein the power management circuit detects an open circuit voltage value of the battery before the discharge operation of the battery is performed, and
   the power management circuit obtains the initial power of the battery according to the open circuit voltage value.

9. The electronic device according to claim 7, wherein the operation of adjusting the first average current value to the second average current value according to the value distribution status by the power management circuit comprises:
   obtaining a first number of a first current value which is larger than the first average current value among the current values;
   obtaining a second number of a second current value which is less than the first average current value among the current values; and
   adjusting the first average current value to the second average current value according to first number and the second number.

10. The electronic device according to claim 9, wherein the second average current value is positively correlated to the first number.

11. The electronic device according to claim 7, further comprising:
   a temperature sensor, configured to detect a temperature of the battery,
   wherein the power management circuit further estimates the remaining power of the battery according to the temperature.

12. The electronic device according to claim 7, wherein the power management circuit further determines whether a total number of the current values is larger than a default value, and
   the power management circuit further estimates the remaining power of the battery according to the first average current value and the initial power of the battery without considering the value distribution status if the total number of the current values is not larger than the default value.

* * * * *